US007932182B2

(12) United States Patent
Wang et al.

(10) Patent No.: US 7,932,182 B2
(45) Date of Patent: Apr. 26, 2011

(54) CREATING NOVEL STRUCTURES USING DEEP TRENCHING OF ORIENTED SILICON SUBSTRATES

(75) Inventors: Yong-Fa A. Wang, Coppell, TX (US); Richard A. Davis, Plano, TX (US); Larry A. Rehn, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 716 days.

(21) Appl. No.: 11/208,177

(22) Filed: Aug. 19, 2005

(65) Prior Publication Data
US 2007/0042606 A1   Feb. 22, 2007

(51) Int. Cl.
*H01L 21/311* (2006.01)
(52) U.S. Cl. ........ 438/700; 257/622; 438/453; 438/424; 438/425
(58) Field of Classification Search .................. 438/700, 438/753, 427, 424, 702, 745, 701, 754, 425, 438/435, 439, 453; 257/622
See application file for complete search history.

(56) References Cited

U.S. PATENT DOCUMENTS

| | | | |
|---|---|---|---|
| 5,166,097 A | 11/1992 | Tanielian | |
| 5,510,655 A | 4/1996 | Tanielian | |
| 5,585,689 A * | 12/1996 | Imura et al. | 313/336 |
| 5,814,889 A * | 9/1998 | Gaul | 257/773 |
| 5,883,012 A | 3/1999 | Chiou et al. | |
| 6,086,453 A | 7/2000 | Fukuoka et al. | 451/5 |
| 6,586,315 B1 | 7/2003 | Dewa | 438/464 |
| 6,593,644 B2 | 7/2003 | Chiu et al. | 257/684 |
| 6,784,099 B1 | 8/2004 | Naem | 438/658 |
| 6,849,523 B2 | 2/2005 | Chao et al. | 438/460 |
| 2003/0117679 A1 * | 6/2003 | Wood et al. | 359/224 |
| 2005/0109081 A1 | 5/2005 | Zribi et al. | |
| 2005/0158669 A1 | 7/2005 | Morales | 430/323 |
| 2006/0093171 A1 * | 5/2006 | Zhe et al. | 381/191 |

FOREIGN PATENT DOCUMENTS

EP   1130631 A1   9/2001

OTHER PUBLICATIONS

Lang W., Silicon Microstructuring Technology, Materials Science and Engineering, Elsevier Sequoia, S.A., vol. 17, No. 1, Sep. 1996, pp. 1-55.
E.M. Chow, V. Chandrasekaran, A. Partridge, T. Nishida, M. Sheplak, C.F. Quate, T.W. Kenny; *Process Compatible Polysilicon-Based Electrical Through-Wafer Interconnects in Silicon Substrates*; Journal of Microelectromechanical Systems, vol. 11, No. 6; Dec. 2002.
H. Kim, K.A. Jenkins, Y. Xie; *Effective Crosstalk Isolation Through $p^+$ Si Substrates With Semi-Insulating Porous Si*; IEEE Electron Device Letters; vol. 23 No. 3, Mar. 2002.
J. Aberson, P. Albert, P. Cusin, B. Dutoit, Y. von Kaenel; Colibrys SA[1]; H. Fettig, R. Hickey, J. Wylde; Bookham Technology[2] *Wafer-Level Separation of MEMS Die With Standard Pick-and-Place Machines*.

* cited by examiner

*Primary Examiner* — Thao X Le
*Assistant Examiner* — Thanh Y Tran (57) ABSTRACT

A potassium hydroxide (KOH) etch process can produce deep high aspect ratio trenches in (110) oriented silicon substrates. The trenches, however, are perpendicular to the (111) direction of the silicon substrate's crystal lattice. The trenches are used to produce thermally isolating areas and through the wafer electrical connections. These structures can be produced in a cost effective manner because of the nearly ideal capabilities of the KOH etch process when it is applied to appropriate materials at appropriate orientations.

18 Claims, 6 Drawing Sheets

CREATING NOVEL STRUCTURES USING DEEP TRENCHING OF ORIENTED SILICON SUBSTRATES

TECHNICAL FIELD

Embodiments relate to the field of semiconductor processing. Embodiments also relate to using potassium hydroxide (KOH) etch processing on (110) oriented silicon to create deep high aspect ratio trenches. The deep high aspect ratio trenches can then be used in the production of other structures that are otherwise difficult to create.

BACKGROUND

Many devices can be produced via semiconductor processing. Semiconductor processing, like any other type of manufacturing, involves moving material through a series of transformative steps until a finished product is produced. Different steps have different complexity and incur different costs. A manufacturer that can produce a product with fewer steps, simpler steps, or less costly steps can often produce the product more inexpensively.

Most semiconductor processing is performed using silicon wafers as a substrate. Some small wafers have a 50 millimeter (mm) diameter and are usually thicker than 200 micrometers (microns). The most common wafers have diameters of 150 mm, 200 mm or 300 mm and are usually thicker than 400 microns.

Silicon wafers are produced from a single crystal. A crystal is a solid material in which the atoms occur in a repeating pattern. The repeating pattern can be used to define a crystal's main crystallographic axes. A flat surface on a crystal is called a face. The relationship between a crystal face and the main crystallographic axes can be expressed in terms of a Miller Index. An example of a Miller Index is (110). One skilled in crystallography can, given knowledge of a crystal and a face's Miller Index, determine exactly how the face intersects the repeating pattern of atoms that forms the crystal. Similarly, a crystal direction refers to a specific direction along the repeating atomic pattern. For example, a (111) direction refers to a specific direction along the main crystallographic axes.

Some semiconductor devices, such as through the wafer (TTW) flow sensors on silicon substrates, have structures requiring costly manufacturing steps. One such structure is a thermal isolator. A thermal isolator can be produced on a silicon substrate by etching a wide deep hole in the substrate and then filling the hole with a thermal insulator. A thermal insulator is a material that has low thermal conductivity. A wide deep hole can be produced fairly inexpensively, but requires an expensive process to fill. For example, achieving good thermal isolation using silicon dioxide, also known as oxide, as the insulating material requires an oxide thickness exceeding 30 microns and a width exceeding 100 microns. Depositing over 30 microns of oxide, however, is an expensive process step.

Another costly structure is a TTW electrical connection. The connection must go completely through the wafer which can be 750 microns thick. Furthermore, the TTW electrical connection must be large enough to carry the amount of electrical current that is required of it. A thick wire can carry more electrical current than a thin wire of the same material. Similarly, a large TTW electrical connection can carry more electrical current than a small one.

Deep reactive ion etching is capable of producing a hole from one side of a wafer to the other large enough for a TTW electrical connection, but is expensive. After the hole is produced, its sidewalls can be oxidized and then it can be filled with an electrically conductive material to produce the TTW electrical connection. Filling the hole with electrically conductive material is also expensive. Current technology requires two expensive steps for producing a TTW electrical connection.

A KOH etch process is capable of producing deep high aspect ratio trenches in (110) oriented silicon. Deep high aspect ratio means that the trench is much deeper than it is wide. The process, however, only produces high sect ratio trenches perpendicular to the (111) direction of the silicon substrate. As such, the KOH etch process has experienced limited use.

Aspects of the embodiments directly address the shortcoming of current technology by exploiting a property of KOH etching of (110) oriented silicon substrates to inexpensively produce deep high aspect ratio trenches. These trenches are then used for inexpensively producing TTW electrical connections and thermal isolators.

BRIEF SUMMARY

It is therefore an aspect of the embodiments to select a silicon substrate with a (110) orientation. As discussed above, (110) orientation refers to a specific relationship between the pattern of atoms in the silicon crystal and the face of the substrate.

It is another aspect of the embodiments to use a potassium hydroxide (KOH) etch process to create an array of trenches in the silicon substrate that are perpendicular to the (111) direction of the silicon substrate. The array of trenches has at least two trenches and the trenches themselves are 5 microns wide or less. The trenches are separated by a rib that is five microns wide or less.

It is also another aspect of the embodiments to oxidize the ribs. The ribs are silicon at first because they are the same material as the silicon substrate. Oxidation is the process of exposing a material to oxygen. In semiconductor processing, silicon is often exposed to oxygen under controlled conditions. Controlled conditions means that the temperature, pressure, amount of oxygen, and other environmental conditions are kept within a narrow range. The oxidation process transforms silicon to silicon dioxide, or oxide.

It is a further aspect of the embodiments to fill the trenches with a thermally insulating material. A thermally insulating material has low thermal conductance. For example, oxide has low thermal conductance. Therefore, the trenches can be filled with oxide. A thermal isolator is formed by oxidizing the ribs and filling the trenches with a thermal insulator such as oxide.

It is an additional aspect of the embodiments to use a KOH etch process to etch a slot in the silicon substrate. A slot is different from a trench because a slot goes completely through the wafer while a trench does not. The slot is ten microns wide or less and is perpendicular to the (111) direction.

It is a yet further aspect of an embodiment to oxidize the sides of the slot. At first, the sides of the slot are silicon because the substrate is silicon. As discussed above, oxidation converts the sidewalls to oxide.

It is a still yet further aspect of an embodiment to fill the slot with electrically conductive material. For example, doped polysilicon is an electrically conductive material and the slot can be filled with it. Another possibility is to deposit polysilicon on the slot sidewall and then use the polysilicon as a seed layer for depositing nickel or tungsten. In this manner, the bulk of the material filling the slot is a metallic conductor. A TTW electrical connection is formed by filling the slot with conductive material.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
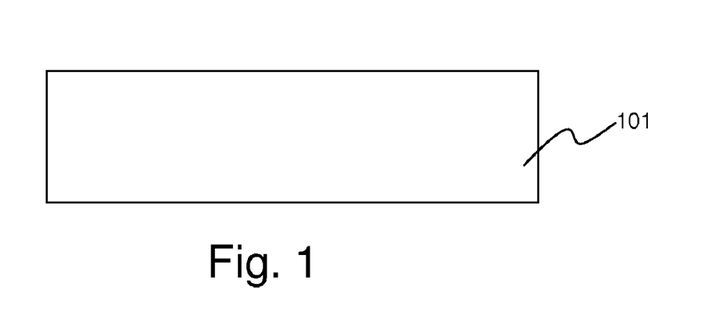
FIG. 1 illustrates a silicon substrate in accordance with an aspect of an embodiment.

FIG. 1 illustrates a silicon substrate 101 in accordance with an aspect of an embodiment. As previously discussed, the silicon substrate 101 has a (110) orientation.

Figure 2:
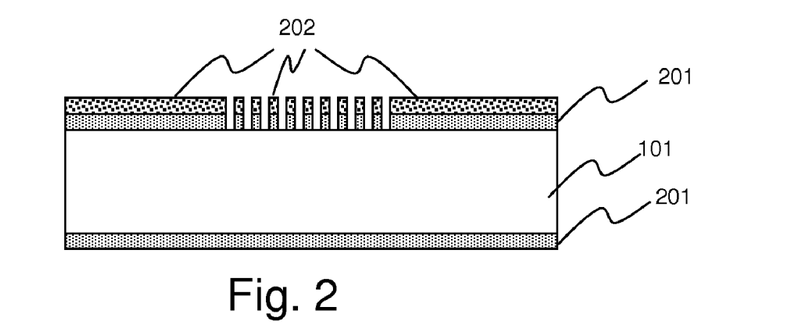
FIG. 2 illustrates a silicon substrate with patterned photoresist and nitride/oxide in accordance with an aspect of an embodiment.

FIG. 2 illustrates a silicon substrate 101 with patterned photoresist 202 in accordance with an aspect of an embodiment. The deposition and patterning of photoresist layers is a standard part of semiconductor processing. The pattern in the patterned photoresist 202 and nitride/oxide 201 is a series of trenches with a line of photoresist between each pair of trenches. The trench widths are five microns or less. The line widths are five microns or less. Five micron trenches and five micron lines give a trench to trench, or line to line, spacing of ten microns. Similarly, a three micron trench and a four micron line give a trench to trench, or line to line, spacing of seven microns. The trenches and lines are perpendicular to the (111) direction of the silicon substrate.

Figure 3:
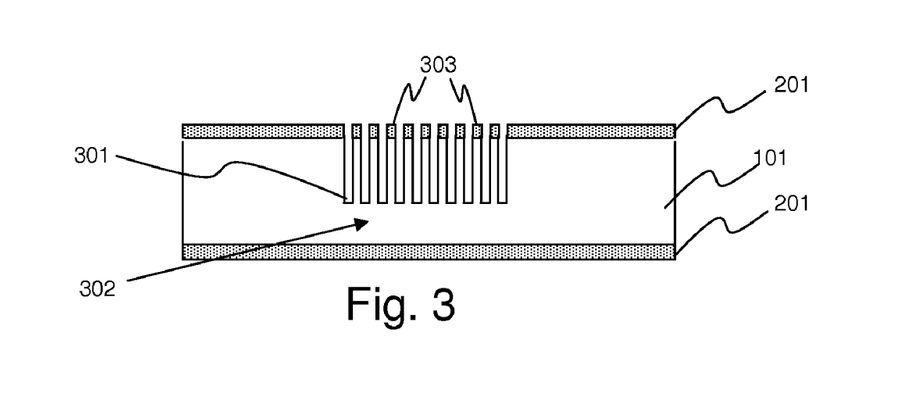
FIG. 3 illustrates a silicon substrate with patterned nitride/oxide and a trench array in accordance with an aspect of an embodiment.

FIG. 3 illustrates a silicon substrate 101 with patterned nitride/oxide 201 and a trench array 302 in accordance with an aspect of an embodiment. The structure illustrated in FIG. 3 can be produced from that of FIG. 2 in a number of different ways. One of those ways is potassium hydroxide (KOH) etching. As described above, KOH etching is advantageous because of orientation of the trench 301 and the crystal lattice of the silicon substrate 101. Deep high aspect ration trenches 302 are produced. Here, deep means thirty microns or more. Etching the trenches leaves ribs 303 of material separating the trenches. The aspect ratio is the ratio of trench depth to trench width. Recall that the trench 301 is at most five microns wide and at least thirty microns deep. As such, the aspect ratio is at least six.

Figure 4:
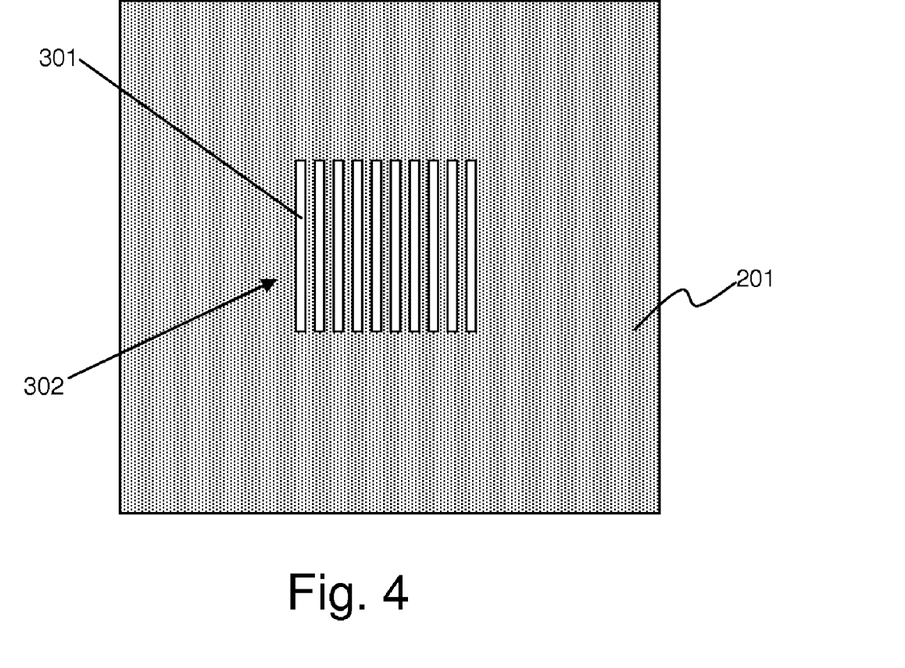
FIG. 4 illustrates a top view of a silicon substrate with patterned nitride/oxide and a trench array in accordance with an aspect of an embodiment.

FIG. 4 illustrates a top view of a silicon substrate (not shown) with patterned nitride/oxide 201 and a trench array 302 in accordance with an aspect of an embodiment. The structure illustrated in FIG. 4 is a top view of the structure illustrated in FIG. 3. The structures illustrated in FIGS. 1-3 and FIGS. 5-15 are side views.

Figure 5:
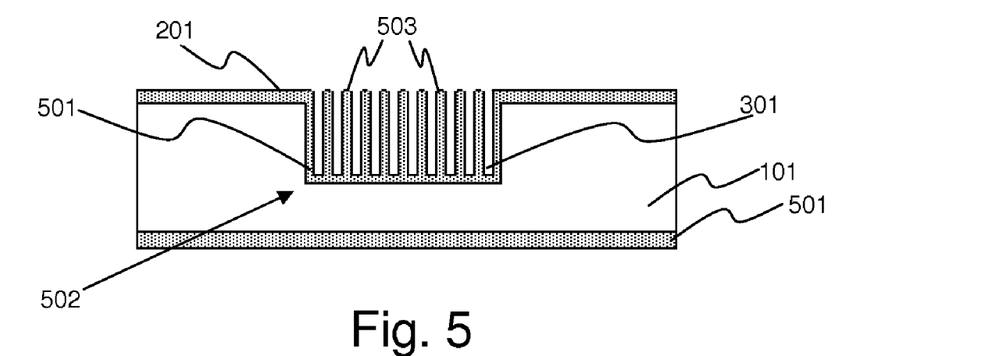
FIG. 5 illustrates a silicon substrate with patterned nitride/oxide and a trench array after oxidation in accordance with an aspect of an embodiment.

FIG. 5 illustrates a silicon substrate 101 with patterned nitride/oxide 201 and a trench array 502 after oxidation in accordance with an aspect of an embodiment. As discussed above, oxidation is process wherein the structure is exposed to oxygen under controlled conditions. Exposing silicon to oxygen produces oxide 501. In FIG. 3, the ribs 303 are silicon because they are the same material as the substrate 101. In FIG. 5, oxidation has caused the ribs 503 to become oxide. The process of oxidation converts the surface of a silicon structure to an oxide layer. The depth of the layer varies based on the conditions under which oxidation occurs. The initial conversion, to a depth of less than a micron, is fast. As the oxide layer thickens, however, oxidation slows. Once the oxide layer reaches a thickness of 2.5 microns, the oxidation process has slowed considerably. Further oxidation can be too slow to be worthwhile. Recalling that the ribs are at most 5 microns wide and that oxidation proceeds from the surface inwards. Each side of each rib 503 is oxidized until the entire rib 503 is oxidized.

Figure 6:
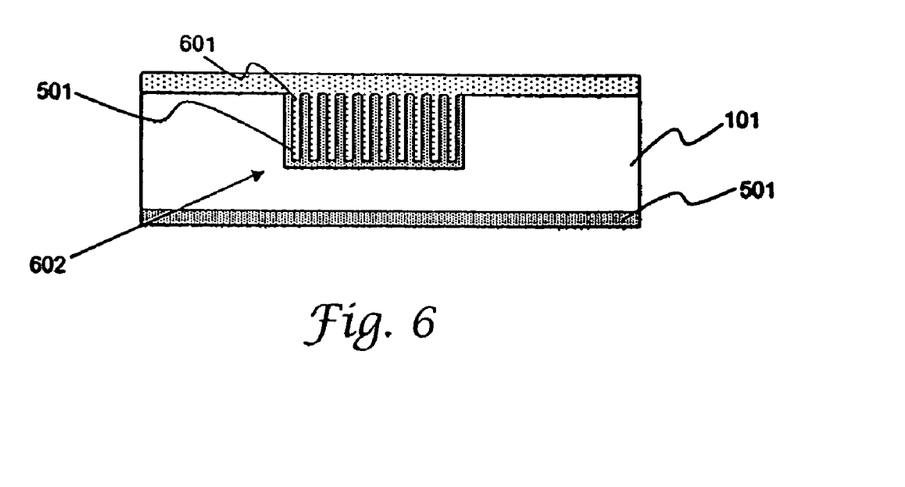
FIG. 6 illustrates a silicon substrate and a trench array after oxidation and filling in accordance with an aspect of an embodiment.

FIG. 6 illustrates a silicon substrate 101 and a trench array 602 after oxidation and filling in accordance with an aspect of an embodiment. The structure illustrated in FIG. 6 can be produce from that illustrated in FIG. 5 by filling the trenches 602 with a thermal insulator 601 and stripping the photoresist. The area of the trench array 602 has a series of strips of oxide 501 where the trench walls once were and thermal insulator 601 where the trenches once were. Oxide is also a thermal insulator. As such, the trench array 602 has become a wide thermally isolating area.

The steps outlined and discussed in relation to FIGS. 1-6 are not intended to be a recipe for creating a wide thermally isolating area. Rather, some steps in creating a wide thermally isolating area are described. One practiced in the art of semiconductor processing can, on contemplation of the foregoing discussion, incorporate these steps, or similar steps, into new and existing processes and create wide thermally isolating areas thereby.

Figure 7:
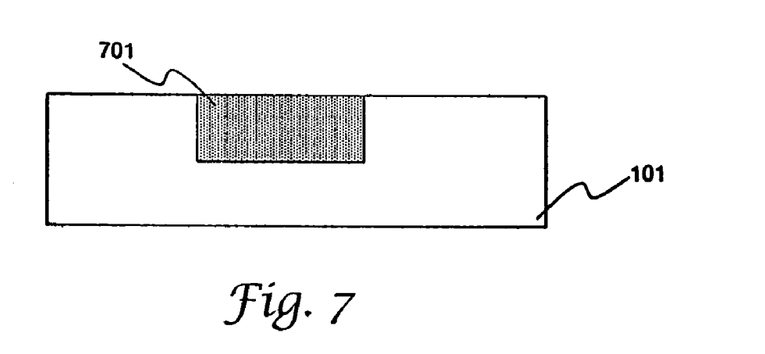
FIG. 7 illustrates a silicon substrate and a trench array after oxidation and filling with oxide in accordance with an aspect of an embodiment.

FIG. 7 illustrates a silicon substrate 101 and a trench array after oxidation and filling with oxide in accordance with an aspect of an embodiment. The structure illustrated in FIG. 7 can be produced from that illustrated in FIG. 5 by filling the trenches with oxide and stripping the resist. As the ribs were already oxide, a wide oxide area 701 is created. The wide oxide area 701 is also a wide thermally isolating area because oxide is a thermal insulator.

Figure 8:
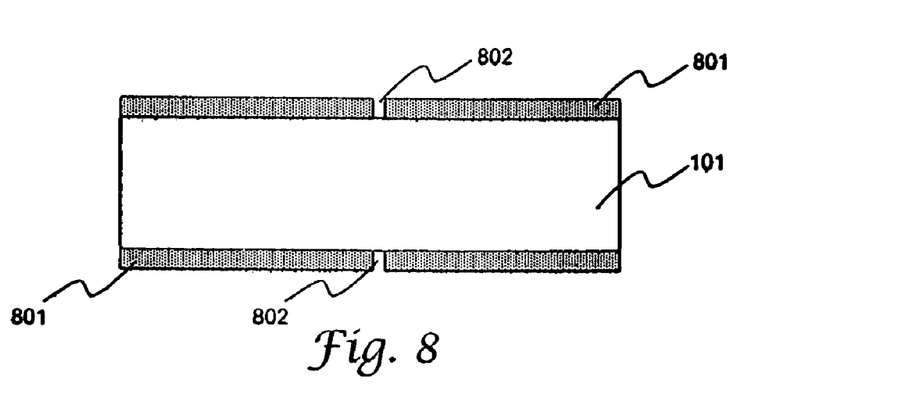
FIG. 8 illustrates a silicon. substrate with patterned nitride/oxide in accordance with an aspect of an embodiment.

FIG. 8 illustrates a silicon substrate 101 with patterned nitride/oxide layers 801 in accordance with an aspect of an embodiment. The structure illustrated in FIG. 8 can be produced from that of FIG. 1 by coating both sides of the substrate with nitride/oxide and patterning via standard semiconductor processing techniques. The patterned nitride/oxide layers 801 each have a trench 802 that is no more than ten microns wide. Each trench 802 in the patterned nitride/oxide 801 is oriented such that an etch process would produce a trench perpendicular to the (111) direction of the (110) oriented silicon substrate 101.

Figure 9:
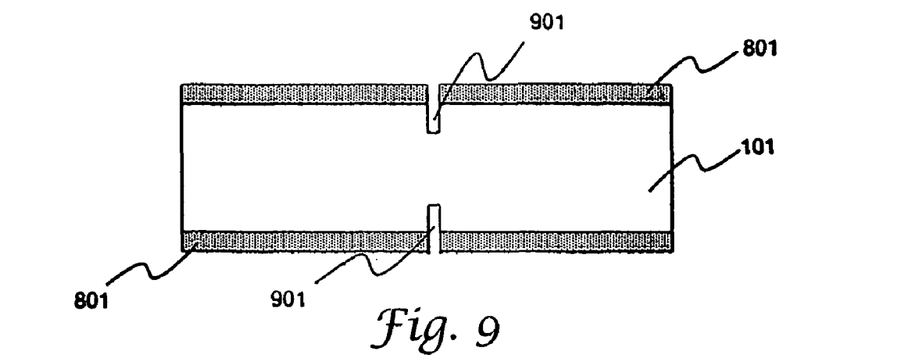
FIG. 9 illustrates a silicon substrate with patterned nitride/oxide and two trenches in accordance with an aspect of an embodiment.

FIG. 9 illustrates a silicon substrate 101 with patterned nitride/oxide 801 and two trenches 901 in accordance with an aspect of an embodiment. The structure illustrated in FIG. 9 can be produced from that of FIG. 8 by exposing both side of the wafer to an etch process. A KOH etch process is ideal for this operation because it is a wet etch process and thereby easier than other etch processes to perform on both sides simultaneously. The KOH etch process is also ideal because, given the orientation of the substrate 101 and trenches 901, it can produce extremely deep high aspect ratio trenches 901.

Figure 10:
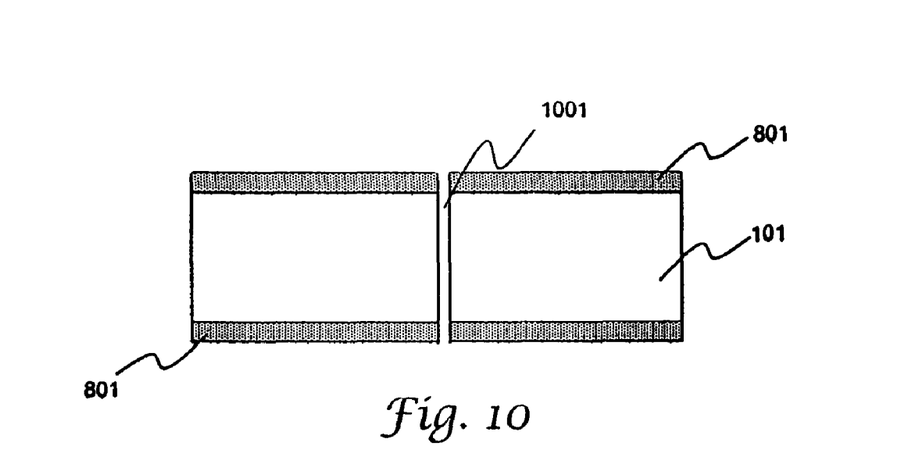
FIG. 10 illustrates a silicon substrate with patterned nitride/oxide and a slot in accordance with an aspect of an embodiment.

FIG. 10 illustrates a silicon substrate 101 with patterned nitride/oxide 801 and a slot 1001 in accordance with an aspect of an embodiment. The structure illustrated in FIG. 10 can be produced from that of FIG. 9 by continuing the etch process until the two trenches 901 meet within the substrate 101.

Figure 11:
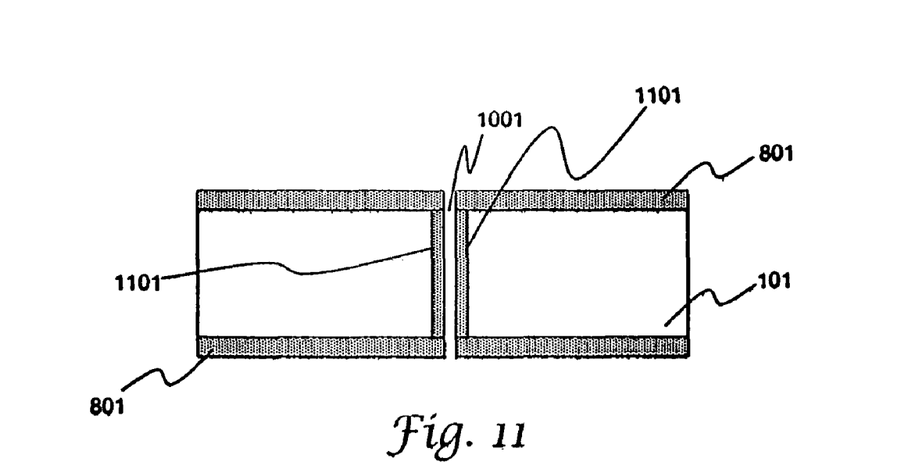
FIG. 11 illustrates a silicon substrate with patterned nitride/oxide and a slot with oxidized sidewalls in accordance with an aspect of an embodiment.

FIG. 11 illustrates a silicon substrate 101 with patterned nitride/oxide 801 and a slot 1001 with oxidized sidewalls 1101 in accordance with an aspect of an embodiment. The structure illustrated in FIG. 11 can be produced from that illustrated in FIG. 10 by exposure to an oxidizing environment. Oxidation processes are discussed above. As is normal for oxidation, the oxide layer 1101 is typically 2.5 microns thick or less.

Figure 12:
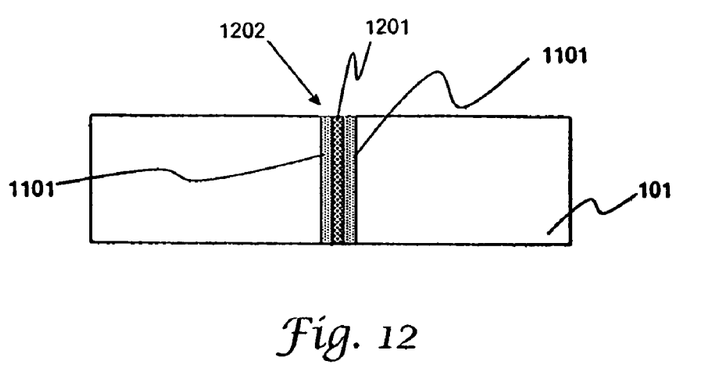
FIG. 12 illustrates a filled slot in a silicon substrate having oxidized sidewalls in accordance with an aspect of an embodiment.

FIG. 12 illustrates a filled slot 1201 in a silicon substrate 101 having oxidized sidewalls 1101 in accordance with an aspect of an embodiment. The structure illustrated in FIG. 12 can be produced from that illustrated in FIG. 11 by filling the slot 1001 with an electrical conductor. The filled slot 1201 forms a through-the-wafer (TTW) electrical connection 1202 that is electrically isolated from the silicon substrate 101 by the oxidized sidewalls 1101. The amount of electrical current that can be carried through the connection 1202 is determined by the material properties of the electrical conductor and the area of the slot. The area of the slot is the width times the length. For example, a five micron wide and 100 micron long slot has an area of 500 square microns. The current capacity of the TTW connection 1202 can be doubled by making the slot 1201 twice as long.

The steps outlined and discussed in relation to FIGS. 8-12 are not intended to be a recipe for creating a wide thermally isolating area. Rather, some steps in creating a wide thermally isolating area are described. One practiced in the art of semiconductor processing can, on contemplation of the foregoing discussion, incorporate these steps, or similar steps, into new and existing processes and create wide thermally isolating areas thereby.

Figure 13:
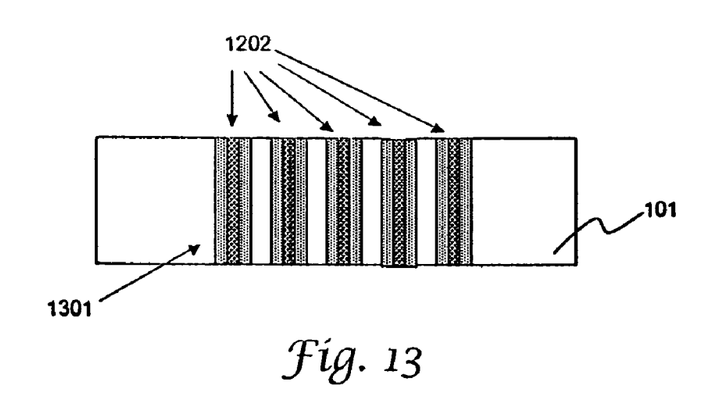
FIG. 13 illustrates TTW electrical connections in a silicon substrate in accordance with an aspect of an embodiment.

FIG. 13 illustrates TTW electrical connections 1202 in a silicon substrate 101 in accordance with an aspect of an embodiment. As discussed above, the current capacity of a TTW connection 1202 can be increased by increasing the slot length. Another way to double current capacity is to produce and use two TTW connections 1202. FIG. 13 illustrates a grouped TTW connection 1301 wherein many individual TTW connections 1202 are grouped together to obtain higher electrical current capacity. The same process steps as used for producing a single TTW connection 1202 can be used to produce a grouped TTW connection 1301.

Figure 14:
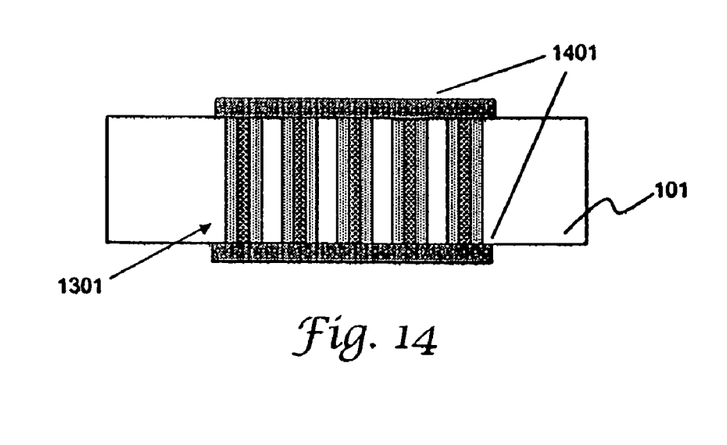
FIG. 14 illustrates a group of slots in a silicon substrate having oxidized sidewalls after filling and deposition of a pad in accordance with an aspect of an embodiment.

FIG. 14 illustrates a grouped TTW connection 1301 in a silicon substrate 101 and a pad 1401 in accordance with an aspect of an embodiment. The structure of FIG. 14 can be produced from that of FIG. 13 by producing a pad 1401 that overlays the grouped TTW connection 1301. The pad 1401 can be produced using any of a variety of common semiconductor processing techniques, such as masking followed by deposition and stripping. One skilled in the art of semiconductor processing can easily create variations of existing process steps for creation of the pad 1401 and all such variations should be considered equivalent. The pad 1401 material is electrically conducting such that an electric current can easily pass into the pad and then through the grouped TTW connection 1301. The purpose of the pad 1401 is to allow the grouped TTW connection 1301 to be treated as a single large connection.

Figure 15:
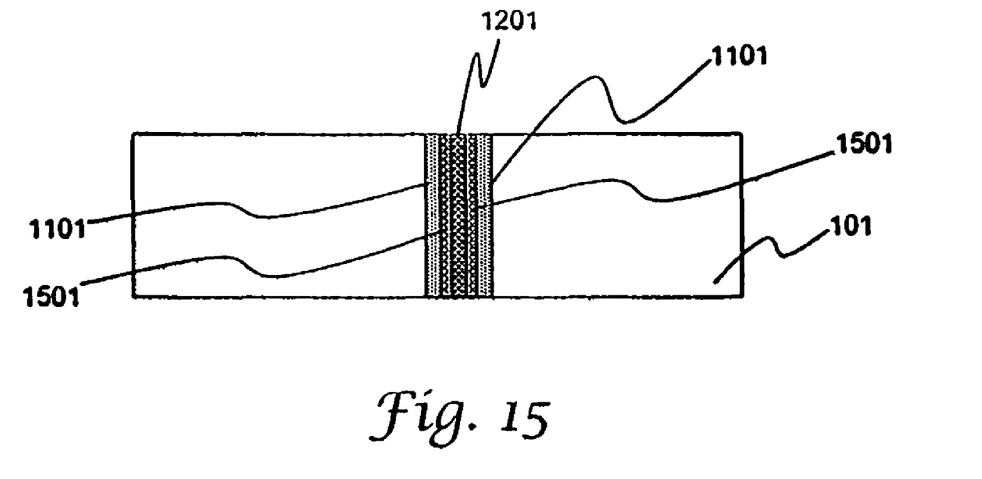
FIG. 15 illustrates a filled slot in a silicon substrate having oxidized sidewalls coated with one material and then filled in accordance with an aspect of an embodiment.

FIG. 15 illustrates a filled slot 1201 in a silicon substrate 101 having oxidized sidewalls 1101 coated with a first material 1501 and then filled in accordance with an aspect of an embodiment. The production of a slot with oxidized sidewalls is discussed above. The structure of FIG. 15 can be produced from that of FIG. 11 by coating the oxidized sidewalls 1101 with a first material, such as doped polysilicon, and then filling the slot with a second material. The reason for using the first material as a coating is that it can act as a seed layer for the subsequent deposition of the second material. For example, a polysilicon layer 1501 can act as a seed layer for a metallic conductor 1201 that fills the slot. Tungsten, nickel, aluminum, copper, and gold are examples of metallic conductors. It is also possible for the second material and the first material to be the same material. For example, a polysilicon layer can be deposited on the sidewalls to act as a seed layer for subsequently filling the slot with polysilicon.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:
1. A method comprising:
    selecting a (110) oriented silicon substrate having a front side and a backside;
    using a KOH etch process to create an array of trenches in the silicon substrate comprising at least two trenches wherein the trenches are perpendicular to a (111) crystal direction, the trenches are five micrometers wide or less, and separated from the other trenches by a rib that is five micrometers wide or less;
    oxidizing the ribs; and filling the array of trenches with a thermally insulating material, thereby creating a wide thermally insulating area.

2. The method of claim 1 further comprising:
using a KOH etch process to create a slot in the silicon substrate wherein the slot is ten micrometers wide or less and perpendicular to the (111) crystal direction(s);
oxidizing the sides of the slot; and
filling the slot with a conductive material, thereby creating an electrical connection passing from the front side, through the silicon substrate, and to the back side.

3. The method of claim 2 wherein the slot is created after the array of trenches is filled.

4. The method of claim 2 wherein the thermally insulating material is oxide.

5. The method of claim 1 wherein the thermally insulating material is oxide.

6. A method comprising:
selecting a (110) oriented silicon substrate having a front side and a backside;
using a KOH etch process to create an array of trenches in the silicon substrate comprising at least two trenches wherein the trenches are perpendicular to a (111) crystal direction, the trenches are five micrometers wide or less, and separated from the other trenches by a rib that is five micrometers wide or less;
oxidizing the ribs;
filling the array of trenches with a thermally insulating material, thereby creating a wide thermally insulating area;
using a KOH etch process to create a slot in the silicon substrate wherein the slot is ten micrometers wide or less and perpendicular to the (111) crystal direction(s);
oxidizing the sides of the slot; and
filling the slot with a conductive material, thereby creating an electrical connection passing from the front side, through the silicon substrate, and to the back side;
wherein the slot is filled with conductive material before the array of trenches is created.

7. A method comprising:
selecting a (110) oriented silicon substrate having a front side and a backside;
using a KOH etch process to create a slot in the silicon substrate wherein the slot is ten micrometers wide or less, perpendicular to a (111) crystal direction(s), and passes completely through the silicon substrate;
oxidizing the sidewall of the slot; and
filling the slot with a conductive material, thereby creating an electrical connection passing from the front side, through the silicon substrate, and to the back side.

8. The method of claim 7 wherein the conductive material is doped polysilicon.

9. The method of claim 7 further comprising selectively depositing a first material on the sides of the slot after oxidizing the side of the slot and thereafter filling the slot with a second material.

10. The method of claim 9 wherein the first material is doped polysilicon.

11. The method of claim 10 wherein the second material is a metallic conductor such as tungsten, nickel, copper, aluminum, or gold.

12. The method of claim 7 wherein the conductive material is a metallic conductor such as tungsten, nickel, copper, aluminum, or gold.

13. The method of claim 7 wherein an array of slots is created, oxidized on the sidewall, and filled with conductive material.

14. The method of claim 13 further comprising creating a pad over the array.

15. A method comprising:
selecting a (110) oriented silicon substrate having a front side and a backside;
using a KOH etch process to create an array of trenches in the silicon substrate comprising at least two trenches wherein the trenches are perpendicular to a (111) crystal direction, the trenches are five micrometers wide or less, and separated from the other trenches by a rib that is five micrometers wide or less;
oxidizing the ribs;
filling the array of trenches with a thermally insulating material, thereby creating a wide thermally insulating area;
using a KOH etch process to create a slot in the silicon substrate wherein the slot is ten micrometers wide or less and perpendicular to the (111) crystal direction(s);
oxidizing the sides of the slot; and
filling the slot with a conductive material, thereby creating an electrical connection passing from the front side, through the silicon substrate, and to the back side.

16. The method of claim 15 wherein the slot is created after the array of trenches is filled.

17. The method of claim 15 wherein the slot is filled with conductive material before the array of trenches is created.

18. The method of claim 15 wherein the thermally insulating material is oxide.

* * * * *